(12) United States Patent
Sakata et al.

(10) Patent No.: US 7,224,599 B2
(45) Date of Patent: May 29, 2007

(54) SEMICONDUCTOR DEVICE

(75) Inventors: Takeshi Sakata, Hino (JP); Kenichi Osada, Tokyo (JP); Riichiro Takemura, Tokyo (JP); Hideyuki Matsuoka, Nishitokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/359,538

(22) Filed: Feb. 23, 2006

(65) Prior Publication Data

US 2006/0139999 A1 Jun. 29, 2006

Related U.S. Application Data

(63) Continuation of application No. 10/754,814, filed on Jan. 12, 2004, now Pat. No. 7,038,961.

(30) Foreign Application Priority Data

May 28, 2003 (JP) ............... 2003-150080

(51) Int. Cl.
*G11C 11/00* (2006.01)
(52) U.S. Cl. ............. 365/148; 365/189.05; 365/230.08
(58) Field of Classification Search ................ 365/100, 365/148, 189.05
See application file for complete search history.

(56) References Cited

U.S. PATENT DOCUMENTS

| | | | | |
|---|---|---|---|---|
| 5,295,258 A | * | 3/1994 | Jewett et al. ................. | 714/12 |
| 5,754,764 A | * | 5/1998 | Davis et al. ................. | 709/200 |
| 6,201,733 B1 | | 3/2001 | Hiraki et al. | |
| 6,263,452 B1 | * | 7/2001 | Jewett et al. ................. | 714/9 |
| 6,385,100 B2 | | 5/2002 | Noda et al. | |
| 6,480,415 B2 | | 11/2002 | Makuta et al. | |
| 6,538,933 B2 | | 3/2003 | Akioka et al. | |
| 6,930,912 B2 | * | 8/2005 | Inui ............................ | 365/158 |
| 2002/0172068 A1 | * | 11/2002 | Hidaka ....................... | 365/100 |

OTHER PUBLICATIONS

Manzur Gill, Tyler Lowrey and John Park, "Ovonic Unified Memory—A High-Performance Nonvolatile Memory Technology for Stand-Alone Memory and Embedded Applications", 2002 IEEE International Solid-State Circuits Conference, Digest of Technical Papers, 3 pages.

(Continued)

*Primary Examiner*—Thong Q. Le
(74) *Attorney, Agent, or Firm*—Reed Smith LLP; Stanley P. Fisher, Esq.; Juan Carlos A. Marquez, Esq.

(57) ABSTRACT

A phase change memory is provided with a write data register, an output data selector, a write address register, an address comparator and a flag register. Write data is not only written into a memory cell but also retained by the write data register until the next write cycle. If a read access occurs to that address before the next write cycle, data is read out from the register without reading the data from the memory cell array. Without elongating the cycle time, it is possible not only to use a long time to write data into a memory cell therein but also to make longer the interval between the time when a write operation is done and the time when the subsequent read operation is made from that memory cell. As a result, data can be written reliably.

5 Claims, 14 Drawing Sheets

OTHER PUBLICATIONS

A. Pirovano, A.L. Lacaita, D. Merlani, A. Benvenuti, F. Pellizzer and R. Bez, "Electronic Switching Effect in Phase-Change Memory Cells", 2002 IEEE International Electron Devices Meeting, Technical Digest, pp. 923-926.

Y.N. Hwang et al., "Completely CMOS-Compatible Phase-Change Nonvolatile RAM Using NMOS Cell Transistors", 2003 Non-Volatile Semiconductor Memory Workshop, Digest of Technical Papers, pp. 91-92.

* cited by examiner

SEMICONDUCTOR DEVICE

CROSS-REFERENCE TO RELATED APPLICATIONS

This application is a Continuation application of U.S. application Ser. No. 10/754,814 filed on Jan. 12, 2004. Priority is claimed based on U.S. application Ser. No. 10/754,814 filed on Jan. 12, 2004, now U.S. Pat. No. 7,038,961 which claims priority to Japanese Patent Application No. 2003-150080 filed on May 28, 2003.

BACKGROUND OF THE INVENTION

1. Field of the Invention

The present invention relates to semiconductor devices and, in particular, to a semiconductor device containing a high-speed non-volatile memory which stores information in memory cells using phase change resistors.

2. Description of the Related Art

Aimed at a high-speed and highly integrated non-volatile memory, the development of phase change memories is now in progress as described in "2002 IEEE International Solid-State Circuits Conference, Digest of Technical Papers, pp. 202–203". In the phase change memory, information is stored by utilizing a phase change material called a chalcogenide material which changes its resistivity depending on the state. Write operations to a phase change resistor are done by supplying a current thereto so that the resistor is heated to change the state. Lowering the resistivity, called a set operation, is done by keeping the resistor at relatively low temperature for enough long time, whereas raising the resistivity, called a reset operation, is done by heating it to relatively high temperature. In addition, a read operation from the phase change material is done by applying such a magnitude of current as not to change the state of the phase change resistor.

In "2002 IEEE International Electron Device Meetings, Technical Digest, pp. 923–926", characteristics of phase change resistors are described. In "2003 Non-Volatile Semiconductor Memory Workshop, Digest of Technical Papers, pp. 91–92), a memory cell composed of a phase change resistor and a NMOS transistor is described.

These documents discuss the potentialities of the phase change memory not only as high-speed ROM (Read-Only Memory) but also as non-volatile RAM (Random Access Memory) which can be the unified memory having both ROM and RAM functions. FeRAM (Ferroelectric RAM) and MRAM (Magnetic RAM) are also under development as other high-speed non-volatile memories. However, it is difficult to reduce the area of the ferroelectric capacitor in FeRAM and therefore the area of the cell. MRAM has also a drawback that high-speed read is difficult since the magnitude of the readout signal is small due to the small change ratio of the magnetoresistance. On the other hand, the phase change memory allows easy scaling since reducing the electrode area of the phase change resistor decreases the power required to change the phase of the phase change resistor. In addition, since the resistance of the phase change resistor changes widely as compared with the magnetoresistance in MRAM, high-speed read operation can be realized. Due to these reasons, phase change resistor-used high speed non-volatile memory is expected to be implemented.

To use the phase change memory as a RAM, write time matters. To lower the resistivity of a phase change resistor, it is necessary to let current flow through the phase for an enough long period, for example, about 20 ns. In addition, after the resistivity is raised, it is necessary to wait for enough time, for example 20 ns, before a read operation is done from that memory cell so that the state of the phase change resistor settles.

To introduce a phase change memory as a non-volatile RAM chip, it is preferable to make the phase change memory compatible in specification with a low power RAM chip so as to minimize the system change. Recently, low power SRAM (Static RAM) chips are widely used as low power RAM chips. Merely replacing the internal memory array of a SRAM chip by a phase change memory array cannot conform to the operational specifications expected for ordinary SRAM chips. After the resistivity-lowering write operation is done, a sufficient amount of write time is required to access the same memory cell. After the resistivity-raising write operation is done, a large amount of time is also required to settle the state of the phase change resistor before the subsequent read access is done to the same memory cell. That is, it is difficult to raise the access speed to the level of low power SRAM chips.

SUMMARY OF THE INVENTION

Accordingly, it is an object of the present invention to implement a highly integrated high-speed non-volatile phase change memory capable of operating reliably in a short operation cycle time.

To achieve this object, according to a major aspect of the present invention, there is provided a phase change memory comprising: plural word lines; plural bit lines which intersect with the plural word lines; a non-volatile memory cell array having plural non-volatile memory cells placed at respective positions where the plural word lines intersect with the plural bit lines; a write buffer which supplies a write data-dependent write signal to the non-volatile memory cell array; an input buffer which supply the write data to the write buffer; and a write data register which is connected to the input buffer and retains the write data.

More preferably, the phase change memory further comprises: an address resistor which retains an address entered from external; and a comparator which compares the entered address with the retained address; wherein if the comparator indicates that the entered address agrees with the retained address, the write data retained in the write data register is output.

Still more preferably, the comparator makes a comparison at the subsequent read access after write is done to a non-volatile memory cell.

DESCRIPTION OF THE PREFERRED EMBODIMENTS

Figure 1:
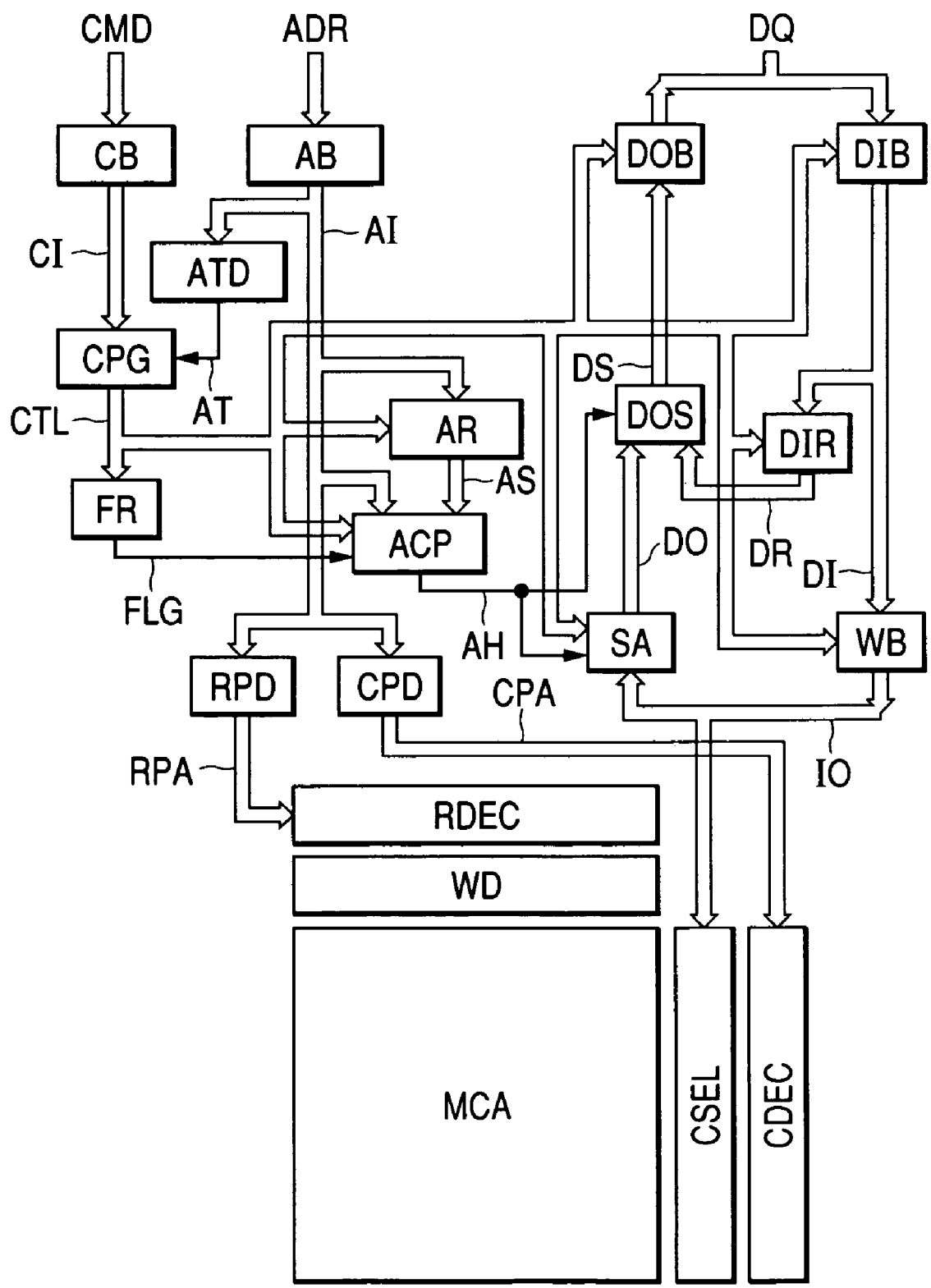
FIG. 1 is a block diagram showing an example of a configuration of the asynchronous phase change memory.

Embodiments of the present invention will be described below with reference to the drawings. Circuit elements which constitute each functional block of the embodiments may be formed on a substrate of a semiconductor such as single-crystalline silicon by using a CMOS (Complementary MOS) transistor and other widely-known integrated circuit technologies while not restrictive particularly. In the drawings, an arrow mark is added to the body of each PMOS transistor in order to differentiate it from a NMOS transistor. Also note that the drawings do not depict how a substrate voltage is given to each MOS transistor. The required connection may be implemented any way as far as the MOS transistor properly operates. In addition, unless otherwise specified, level low of each signal represents '0' while level high '1'.

First Embodiment

FIG. 1 is a block diagram of a key portion of an asynchronous phase change memory configured in accordance with the present invention. Generally, in an asynchronous phase change memory, an operation is performed depending on the state of the command signal when an address transition is detected, while not restrictive. The asynchronous phase change memory of the present invention, shown there, is characterized in that it has a write data register DIR, an output data selector DOS, a write address register AR, an address comparator ACP and a flag register FR. This asynchronous phase change memory also has a command buffer CB, a control signal generator CPG, an address buffer AB, an address transition detector ATD, a row predecoder RPD, a column predecoder CPD, an input buffer DIB, an output buffer DOB, a sense amplifier block SA and a write buffer block WB. Further, a memory cell array MCA is formed with a row decoder RDEC, a word driver WD, a column decoder CDEC and a column selector CSEL. Although only one memory cell array MCA is shown in the figure, a plurality of memory cell arrays MCAs may be included depending on the capacity of each memory cell. For simplification, redundancy circuits, etc. are omitted in this figure.

Figure 2:
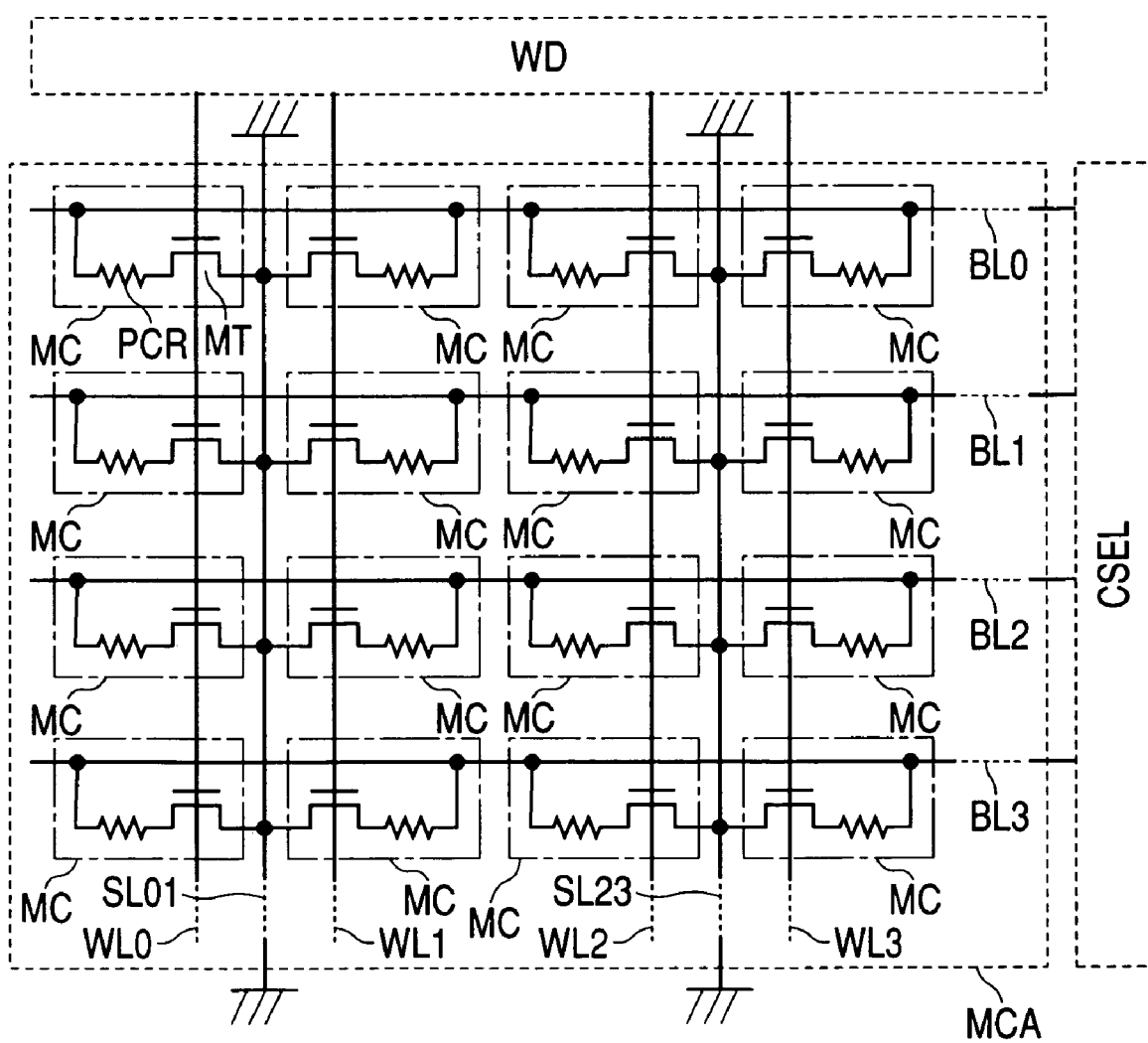
FIG. 2 shows an example of a configuration of the memory array.

FIG. 2 shows an example of a configuration of the memory cell array MCA. Memory cells MCs are formed respectively where word lines WL0, WL1, WL2, WL3, . . . which are connected to the word driver WD are intersected with bit lines BL0, BL1, BL2, BL3, . . . which are connected to the column selector CSEL. In addition, the memory cell array MCA has source lines SL01, SL23, . . . connected to the ground voltage VSS. Each memory cell MC is composed of a phase change resistor PCR and a memory cell transistor MT. One end of the phase change resistor PCR is connected to a bit line whereas the other end is connected to the source or drain of the memory cell transistor MT. The phase change resistor PCR is made of a chalcogenide material containing germanium, antimony, tellurium, etc. The other end of the memory cell transistor, source or drain, is connected to a source line whereas the gate is connected to a word line. Note that although not shown in the figure for simplification, dummy cells are also formed to generate a reference signal at read operation. In addition, although the memory cell transistors are depicted as NMOS transistors, it is also possible to use PMOS transistors or bipolar transistors. MOS transistors are desirable in view of high integration and NMOS transistors are preferable to PMOS transistors due to their lower on-state channel resistance. In the following operational description in terms of voltage relations, it is assumed that NMOS transistors are used as the memory cell transistors. Also note that the bit lines are sometimes denoted as data lines.

The following describes the roles of the respective circuit blocks. According to an external command signal CMD which is taken in by the command buffer CB, the control signal generator CPG generates a control signal CTL to control the write data register DIR, output data selector DOS, write address register AR, address comparator ACP, flag register FR, input buffer DIB, output buffer DOB, sense amplifier block SA, write buffer block WB, etc. The address buffer AB takes in an address ADR from external and sends an internal address AI to the write address register AR, address comparator ACP, address transition detector ATD, row predecoder RPD and column predecoder CPD. The address transition detector ATD detects a transition of the internal address AI and outputs an address transition signal AT to the control signal generator CPG. Specifically, the address transition signal AT is obtained by performing a logical operation on each address bit to detect a transition and then a logical OR operation on the bitwise results. Until the next write operation, the write address register AR retains the write address while outputting the retained write address AS to the address comparator ACP. The flag register FR outputs a flag FLG indicating whether the write address AS retained by the write address register AR is valid. If the flag FLG is '1', the address comparator ACP compares the retained write address AS with the internal address and outputs an address hit signal AH to the sense amplifier block SA and output data selector DOS. Specifically, the address hit signal AH is obtained by performing an exclusive NOR operation (exclusive OR and negation) on each address bit and then an AND operation on the bitwise results. When the flag FLG is '0', non-hit is assumed with the address hit signal AH de-asserted to '0'.

A row address predecoder RPD predecodes the row address and outputs a row predecoder address RPA to the row decoder RDEC. The row decoder RDEC further decodes the row predecoder address. According to the decoding, the word driver WD selectively drives a word line in the memory cell array MCA. A column address predecoder CPD predecodes the column address and outputs a column predecode address CPA to the column decoder CDEC. The column decoder CDEC further decodes the column predecode address CPA. According to the decoding, the column selector CSEL selectively connects a bit line in the memory cell array MCA to an input output line IO.

The input buffer DIB takes in data from external input output data DQ at a desired timing and sends input data DI to the write data register DIR and write buffer block WB.

Until the next write operation, the write data register DIR retains the write data while outputting the retained write data DR to the output data selector DOS. For a write operation, the write buffer block WB drives the input output line IO according to the input data DI. The sense amplifier block SA includes as many sense amplifiers as the number of bits which operates concurrently. For a read operation, it amplifies and reads the signal on the input output line IO and outputs the read data DO. The output data selector DOS selects either the read data DO or the retained write data DR depending on the address hit signal AH and outputs the selected data as output data DS. The output buffer DOB outputs the output data DS to the input output data DQ at a desirable timing.

The aforementioned configuration can be controlled in the same manner as a conventional asynchronous SRAM. Write data is not only written into memory cells but also stored in the write data register and retained therein until the next write cycle. If a read access occurs to the address before the next write cycle, the data is read out from the write data register without accessing the memory array. This makes it possible to substantially elongate the period allowed to write to a memory cell and read from the same memory cell without elongating the cycle time. Write to a memory cell leaves it in an unstable state for a while. Since immediate read from such an unstable memory cell is not performed, reliable operation is possible. In other words, the cycle time can be shortened since it is not restricted by the period for which reading from a memory cell is not allowed after the resistance of the memory cell is raised.

Figure 3:
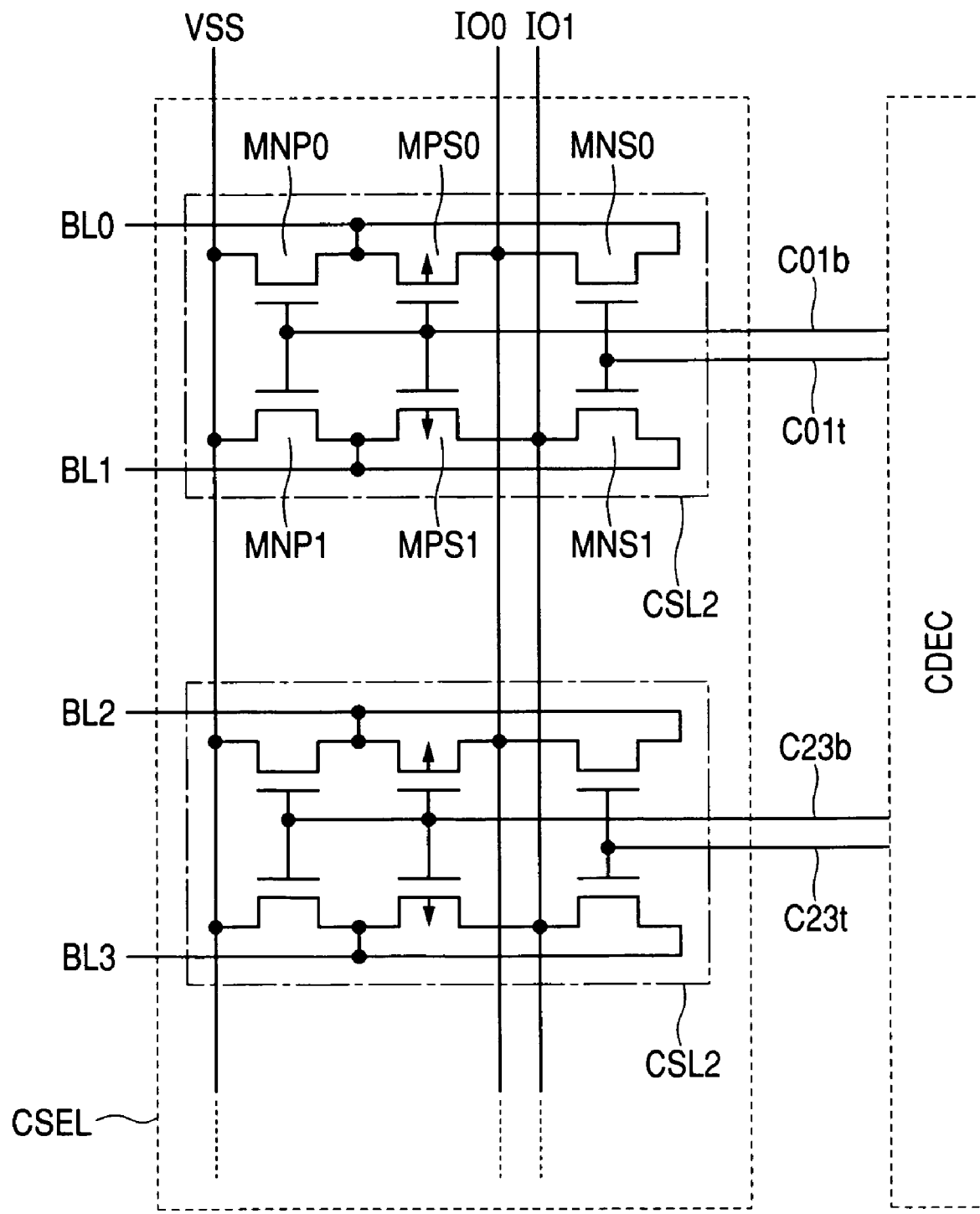
FIG. 3 is a circuit diagram showing an example of an configuration of the column selector.

Of the circuit blocks shown in FIG. 1, characteristic ones are described below. FIG. 3 is an example of a configuration of the column selector CSEL in FIG. 1. In this example, two bits of memory cells are selected from the memory array at a time although the configuration may be modified so as to select a different number of memory cells at a time. A column switch CSL2 is provided for every two bit lines. Under control of the column select signal output by the column decoder CDEC, each column switch CSL2 connects each two bit lines to input output lines IO0 and IO1 respectively. The column select signal is composed of pairs C01b and C01t, C23b and C23t, . . . , each of which has two mutually complementary bits. Each column switch CSL2 comprises four NMOS transistors MNP0, MNP1, MNS0 and MNS1 and two PMOS transistors MPS0 and MPS1. The NMOS transistors MNP0 and MNP1 respectively retain the bit lines to the ground voltage VSS when not selected. The NMOS transistors MNS0 and MNS1 and the PMOS transistors MPS0 and MPS1 constitute two CMOS path gates and connect the bit lines to the input output lines IO0 and IO1 when selected. Use of a CMOS path gate between a bit line and an input output line allows low resistance connection between them. This allows the bit line to be applied in a wide range of voltage, making it possible to secure a margin not only between the magnitude of current flowing through the resistivity-raised phase change resistor and that flowing through the resistivity-lowered phase change resistor for read operation but also between the resistivity-raising current and the resistivity-lowering current for write operation.

Figure 4:
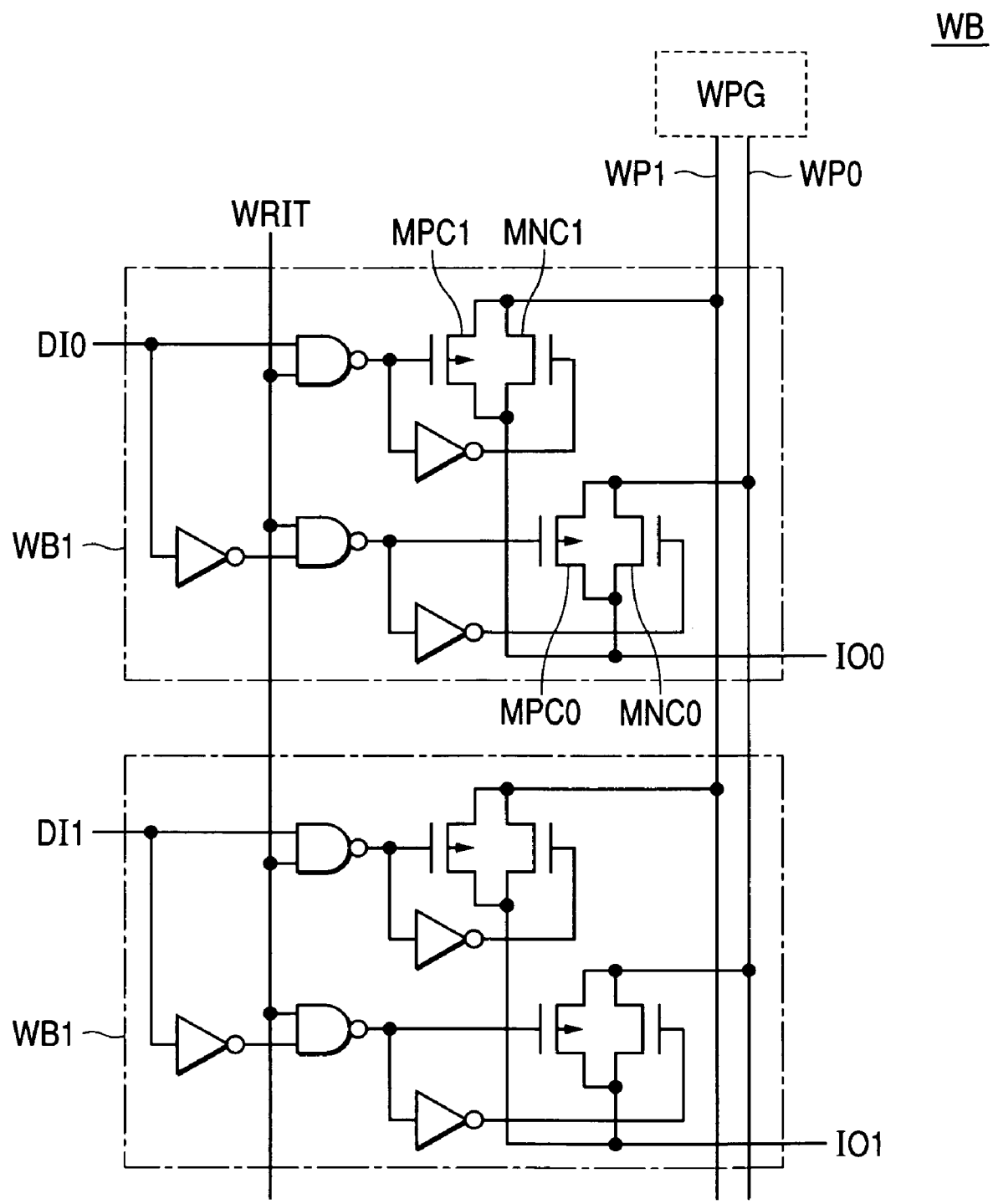
FIG. 4 shows an example of a configuration of the write circuit.

FIG. 4 is an example of a configuration of the write buffer block WB in FIG. 1. It comprises a write pulse generator WPG and two write buffers WB1s. Also in this example, write is concurrently performed to two memory cells in the memory cell array. The number of memory cells to which write is concurrently done can be changed by changing the number of write buffers WB1s accordingly. The write pulse generator WPG generates resistivity-lowering and resistivity-raising pulses and outputs them respectively to write pulse lines WP0 and WP1. Each write buffer WB1 has three inverters, two two-input NAND gates and two CMOS path gates each composed of two NMOS transistors MNC1, MNC0 and two PMOS transistors MPC1, MPC0. If enabled by a write instruction signal WRIT, the write buffer block WB respectively connects the input output lines 100 and 101 to the write pulse line WP0 or WP1 according to the write data DI0 and DI1. The CMOS path gates used therein allows the input and output lines 100 and 101 to be driven to the ground voltage at their falling edges by the write pulse generator WPG. This can sharpen the falling edge of the pulse waveform of the bit line current to realize stable write operation since the charge accumulated to the parasitic capacitance of the input and output line is prevented from discharging through the bit line and memory cell.

Figure 5:
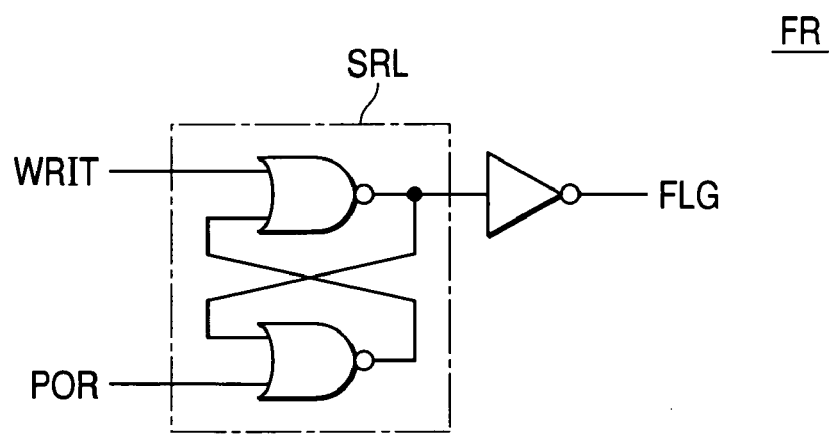
FIG. 5 is a circuit diagram showing an example of a configuration of the flag control circuit.

FIG. 5 is an example of a configuration of the flag register FR in FIG. 1. It has a set-reset latch SRL composed of two cross-coupled two-input NOR gates, and an inverter. Upon power on, the flag FLG goes '0' since the latch SRL is reset by a power on reset signal POR. Thereafter, when the first write is done, the latch SRL is set by the write instruction signal WRIT to set the flag FLG to '1'. The power on reset signal POR is generated by a widely-known power on reset circuit which detects the rising edge of the power supply.

In a non-volatile RAM which is just powered on, it is possible that its first operation is to read data written before the last power off. In the power off sequence, the retained write address AS in the write address register AR and the retained write data DR in the write data register DIR are reset. Therefore, it is necessary to prevent the reset write data DR from being read out as output data when read is done from the reset address AS. Using such a flag register as in FIG. 5 allows the flag FLG to remain '0' until the retained write address AS and retained write data DR become valid by the first write operation after the power supply is turned on so that any read operation before the first write operation is done from the memory cell array.

If the sizes of the transistors in the latch SRL comprising two NOR gates are properly adjusted, it is possible to implement the same function by connecting the latch SRL to the ground voltage VSS instead of the power on reset signal POR. In this case, wiring of the power on reset signal POR can be simplified. Further, the power on reset circuit may be omitted in some situations.

Figure 6:
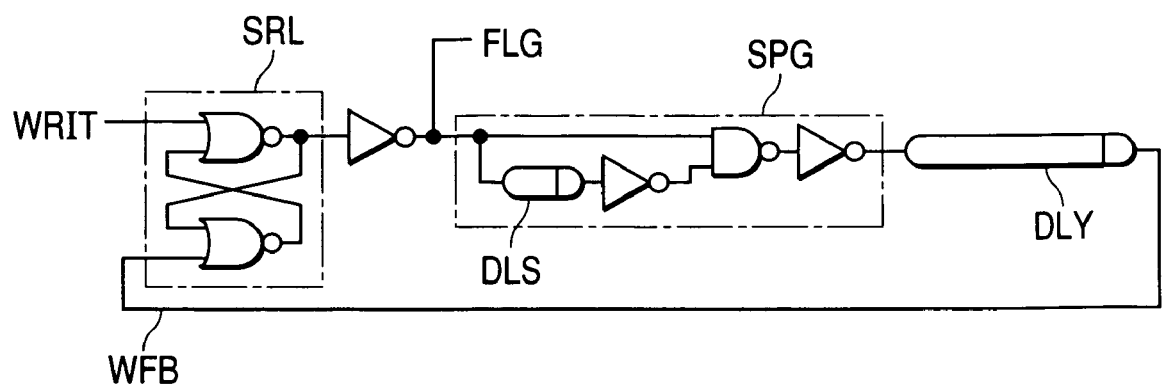
FIG. 6 is a circuit diagram showing another example of a configuration of the flag control circuit.

FIG. 6 shows another example of a configuration of the flag register FR. It comprises a set-reset latch SRL, an inverter, a shot pulse generator SPG composed of two inverters and a two-input NAND gates, and a delay circuit DLY. The write instruction signal WRIT sets the latch SRL which in turn sets the flag FLG to '1'. Thereafter, the feedback signal WFB output from the delay circuit DLY resets the latch SRL which in turn resets the flag FLG to '0'. The delay circuit DLY is designed to provide a delay time during which stable read operation becomes possible from a memory cell after a resistivity-raising pulse is applied to the phase change resistor therein. In addition, the delay time is scaled so as to make the pulse width of the feedback signal WFB narrower than that of the write instruction signal WRIT. This prevents the write instruction signal WRIT and feedback signal WFB from becoming '1' simultaneously, which may cause the flag register FLG to malfunction.

The power on reset signal used for the flag register shown in FIG. 5 has a possibility that it may not go '1' if the power supply voltage does not properly rise when the power supply is turned on or it may happen to go '1' due to a bump of the power supply. In the case of the flag register in FIG. 6, since the flag FLG is automatically reset after the write duration, the flag FLG surely goes '0' in a certain time after the power supply is turned on. This eliminates the possibility of malfunctioning although it takes longer time until the read operation becomes possible after the power supply is turned on.

Figure 7:
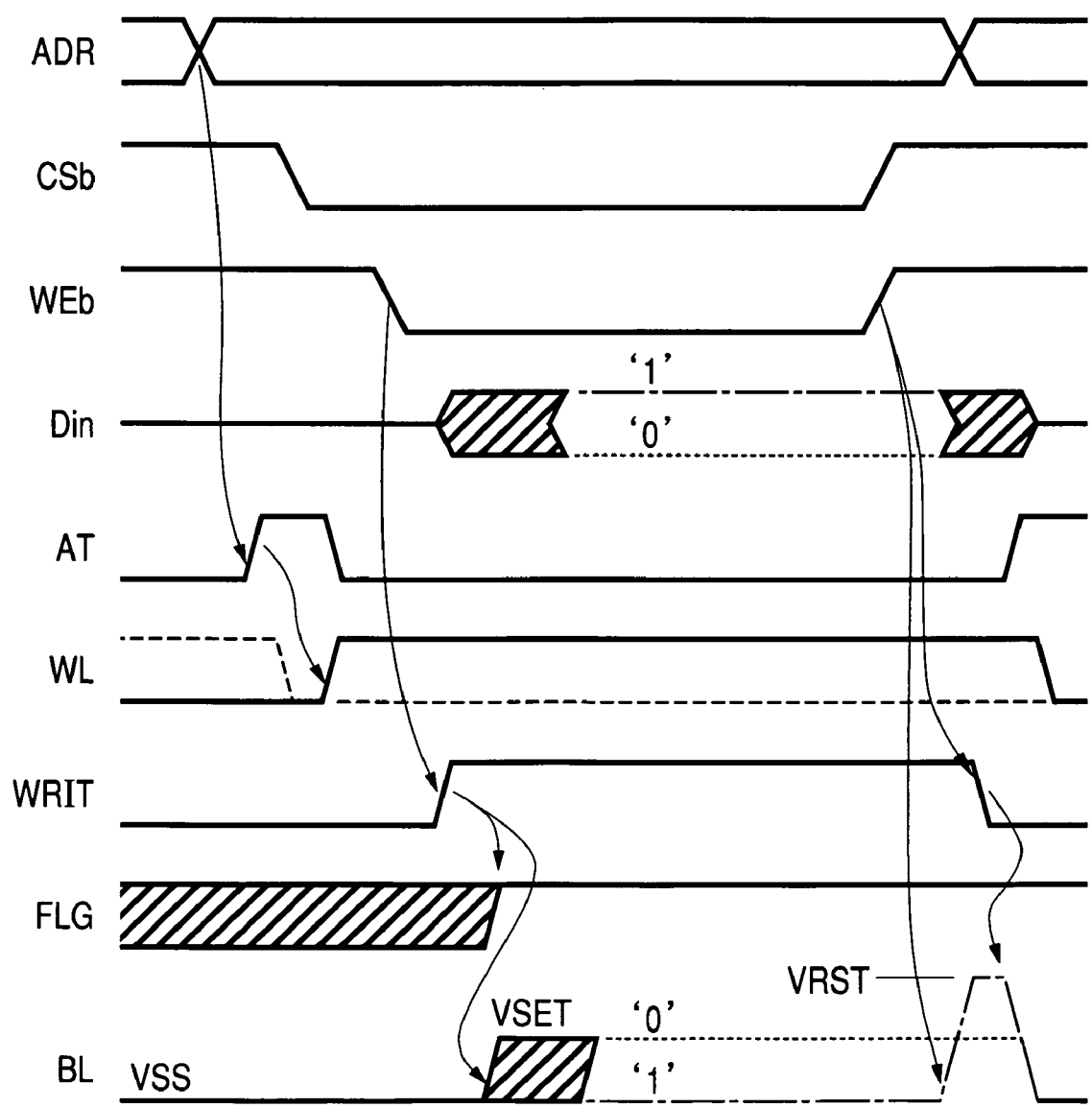
FIG. 7 is a diagram showing an example of a write operation in the asynchronous phase change memory.

The following describes how the above-described asynchronous phase change memory operates. FIG. 7 shows an example of its timing sequence for a write operation. In response to a transition of the external address ADR, the address transition detector ATD generates a pulse on the address transition signal AT, which switches the selected word line WL (among WL0, WL1, WL2, WL3, . . . in FIG. 2). A chip select bar signal CSb and write enable bar signal WEb, parts of the command signal CMD, fall to the low level, which sets the write instruction signal WRIT to '1' to initiate a write operation with the flag FLG set to '1'. According to the input Din to the input output data DQ, a selected bit line BL (BL0, BL1, BL2, BL3, . . . in FIG. 2) is driven. Here, if the input Din is '0', the bit line BL is driven to a set voltage VSET, whereas if Din is '1', the bit line BL is kept at the ground voltage VSS. When either the chip select bar signal CSb or the write enable bar signal WEb rises to the high level to terminate the write operation period, the write address register AR and write data register DIR respectively take in the internal address AI and input data DI. If the input Din is '1', the bit line BL is driven to a reset voltage VRST. To terminate the write operation, the write instruction signal WRIT is set to '0' with the bit line BL returned to the ground voltage VSS so that the resistivity-raising pulse has a desirable pulse width. Note that it is assumed here that Din is 1-bit long. If Din has plural bits, data-dependent operation is performed on an each bit basis. This assumption is taken also in the following description of other operation timings.

In the case of an ordinary asynchronous SRAM, it is specified that the input Din is validated when a write operation period is terminated. In FIG. 7, if the input Din is '0', the bit line continues to be driven to secure the resistivity lowering period. If the input Din is '1', the bit line begins to be driven upon invalidation so as not to excessively raise the temperature around the phase resistor in the selected memory cell since excessive heating elongates the cool down period. Thus, stable write operation can be realized both for '0' and '1'. In addition, limiting the resistivity-raising pulse width realizes lower power write operation since the write current is not supplied longer than necessary.

Figure 8:
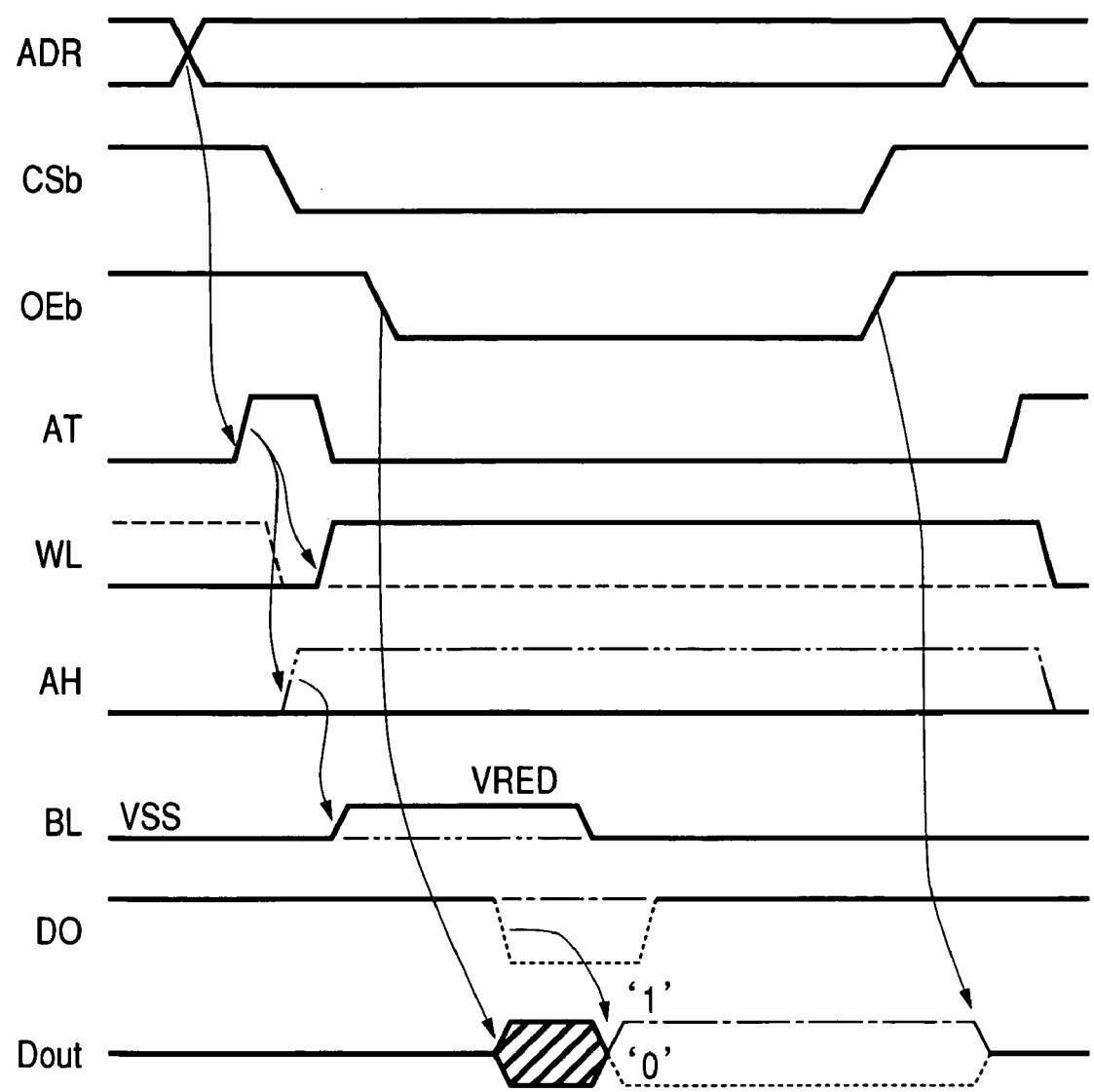
FIG. 8 shows an example of a read operation in the asynchronous phase change memory.

FIG. 8 shows an example of the timing sequence for a read operation. As with the write operation shown in FIG. 7, the word line WL is switched in response to a transition of the external address ADR. If the flag FLG is '1', a pulse on the address transition signal AT activates the address comparator ACP to compare the internal address AI with the retained write address AS and output the result on the address hit signal AH. If the address hit signal AH is '0', a read voltage VRED is supplied to the selected bit line BL for a desirable period by the sense amplifier via the input output line IO and column selector CSEL while data distinction is performed based on the magnitude of the flowing current. The read data DO, output from the sense amplifier block, is output by the data selector DOS as output data DS. If the address hit signal AH is '1', the sense amplifier remains in the standby state to keep the bit line BL to the ground voltage VSS. The data selector DOS outputs the retained write data DR as output data DS. When the chip select bar signal CSb and output enable bar signal OEb, parts of the command signal CMD, fall to the low level, the output buffer is activated to drive the input output data DQ to the output level Dout according to the output data DS. When either the chip select bar signal CSb or the output enable bar signal OEb rises to the high level to terminate the read operation period, the output buffer DOB is forced into the high impedance state.

By controlling the voltage supply to the bit line by the address hit signal AH as mentioned above, it is possible to prevent the phase change resistor from becoming unstable by a voltage which otherwise may be applied thereto immediately after the resistivity is raised. This is effective also when the memory is used as an asynchronous SRAM since address comparison can be controlled on an each address transition basis by using the address transition detector.

Second Embodiment

Figure 9:
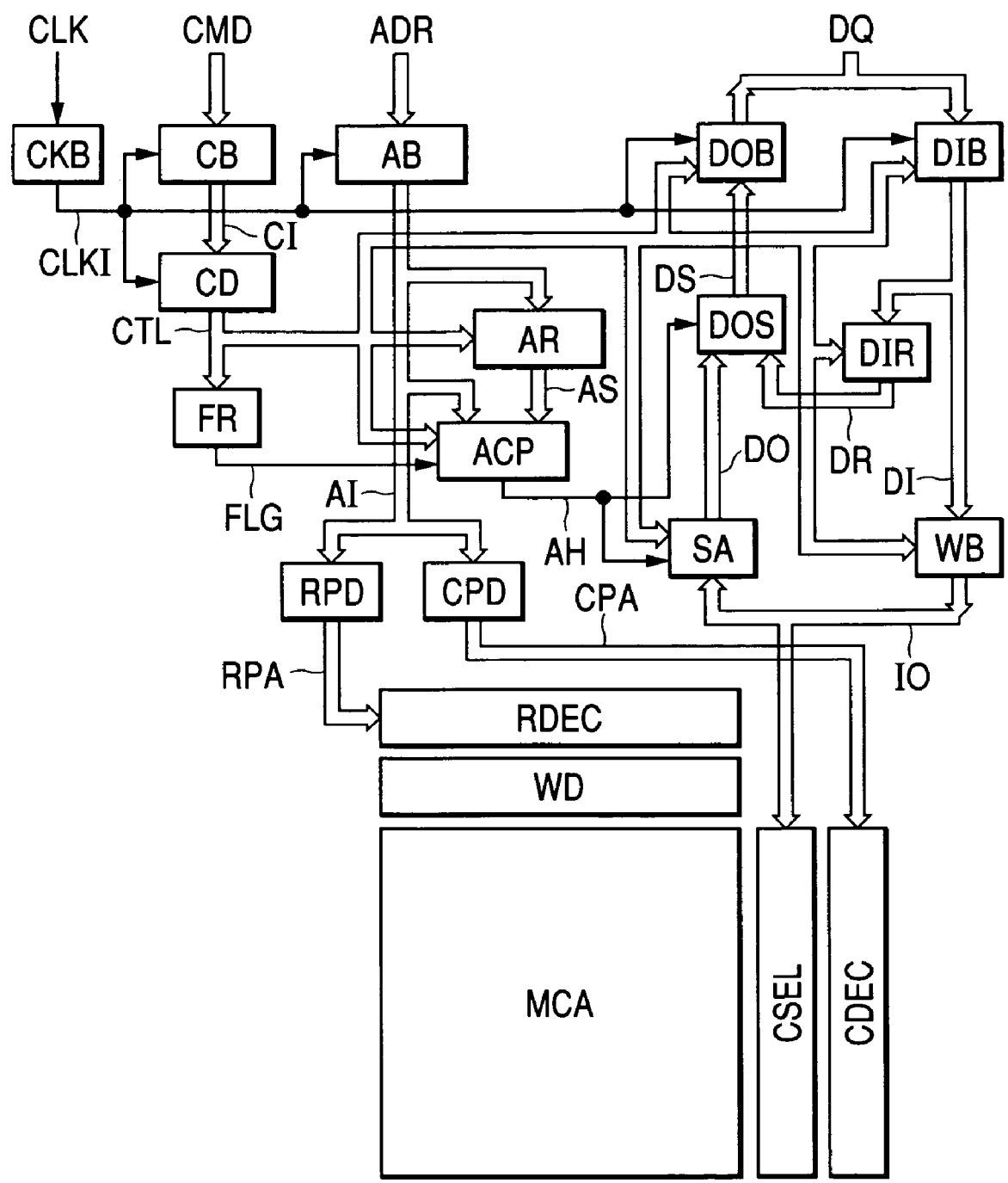
FIG. 9 is a block diagram showing an example of a configuration of a synchronous phase change memory.

FIG. 9 is a block diagram of a key portion of a synchronous phase change memory configured in accordance with the present invention. Generally, a synchronous phase change memory takes in a command and address and performs an operation based on an external clock signal. As with the embodiment of an asynchronous phase change memory, shown in FIG. 1, this synchronous phase change memory of the present invention, shown in FIG. 9, includes a write data register DIR, an output data selector DOS, a write address register AR, an address comparator ACP and a flag register FR. It also includes a clock buffer CKB, a command buffer CB, a command decoder CD, an address buffer AB, a row predecoder RPD, a column predecoder CPD, an input buffer DIB, an output buffer DOB, a sense amplifier block SA and a write buffer block WB. Further, a memory cell array MCA is formed with a row decoder RDEC, a word driver WD, a column decoder CDEC and a column selector CSEL. The memory cell array MCA has the same configuration as shown in FIG. 2. Although only one memory cell array MCA is shown in FIG. 9, a plurality of memory cell arrays MCAs may be included.

The following describes the roles of the respective circuit blocks. The clock buffer CKB receives an external clock CLK and outputs an internal clock CLKI. Controlled by this internal clock CLKI, the command decoder CD generates a control signal CTL to control the operation of each circuit block according to an external command signal CMD which is taken in by the command buffer CB. In response to the internal clock CLKI, the address buffer AB takes in an address ADR from external and outputs an internal address AI. As with the asynchronous phase change memory shown as the first embodiment in FIG. 1, the write address register AR retains the write address until the next write operation while outputting the retained write address AS to the address comparator ACP. The flag register FR outputs a flag FLG indicating whether the write address AS retained by the write address register AR is valid. If the flag FLG is '1', the address comparator ACP compares the retained write address AS with the internal address and outputs an address hit signal AH to the sense amplifier block SA and output data selector DOS.

A row address predecoder RPD predecodes the row address and outputs a row predecoder address RPA to the row decoder RDEC. The row decoder RDEC further decodes the row predecoder address. According to the decoding, the word driver WD selectively drives a word line in the memory cell array MCA. A column address predecoder CPD predecodes the column address and outputs a column predecode address CPA to the column decoder CDEC. The column decoder CDEC further decodes the column predecode address CPA. According to the decoding, the column selector CSEL selectively connects a bit line in the memory cell array MCA to an input output line IO.

According to the internal clock CLKI in timing, the input buffer DIB takes in data from input output data DQ and sends the input data DI to the write data register DIR and write buffer block WB. Until the next write operation, the write data register DIR retains the write data while outputting the retained write data DR to the output data selector DOS. For a write operation, the write buffer block WB drives the input output line IO according to the input data DI. For a read operation, the sense amplifier block SA amplifies and reads the signal on the input output line IO and outputs the read data DO. The output data selector DOS selects either the read data DO or the retained write data DR depending on the address hit signal AH and outputs the selected data as output data DS. The output buffer DOB outputs the output data DS to the input output data DQ in response to the internal clock CLKI.

Figure 10:
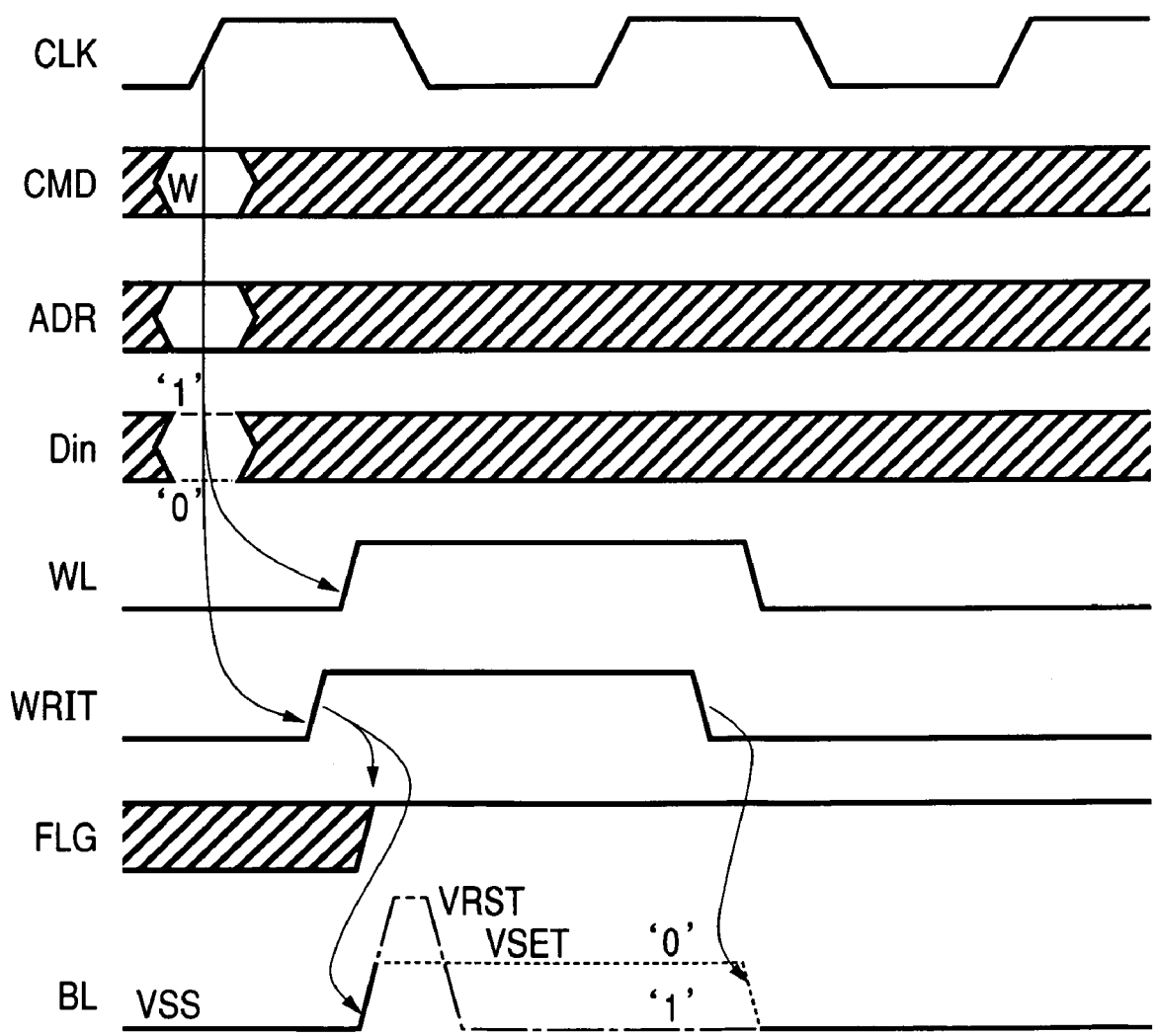
FIG. 10 shows an example of a write operation in the synchronous phase change memory.

FIG. 10 shows an example of the timing sequence for a write operation. At each rising edge of the external clock CLK, the command decoder CD checks the command signal CMD. If a write command W is given, an address ADR is taken into the address buffer AB and then a word line WL is selected. The write instruction signal WRIT goes '1' to set the flag FLG to '1'. The input Din to the input output data DQ is taken into the input buffer to drive the selected bit line BL. Here, if the input Din is '0', the bit line BL is driven to a set voltage VSET, whereas if Din is '1', the bit line BL is driven to a reset voltage VRST. After the bit line is driven for a desirable period which depends on the input Din, the bit line BL and word line WL are returned to the ground voltage VSS to terminate the write operation.

Unlike the asynchronous operation shown in FIG. 7, the valid input Din is taken in simultaneously with the write command. Therefore, when the input Din is '0', it is possible to drive the bit line BL to the set voltage VSET long enough to lower the resistivity of the phase change resistor. When the input Din is '1', since the bit line BL can immediately be driven to the reset voltage VRST, the resistivity of the phase change resistor can be raised earlier. Therefore, after the resistivity is raised, a longer time interval can be secured before the subsequent read operation from that memory cell.

Figure 11:
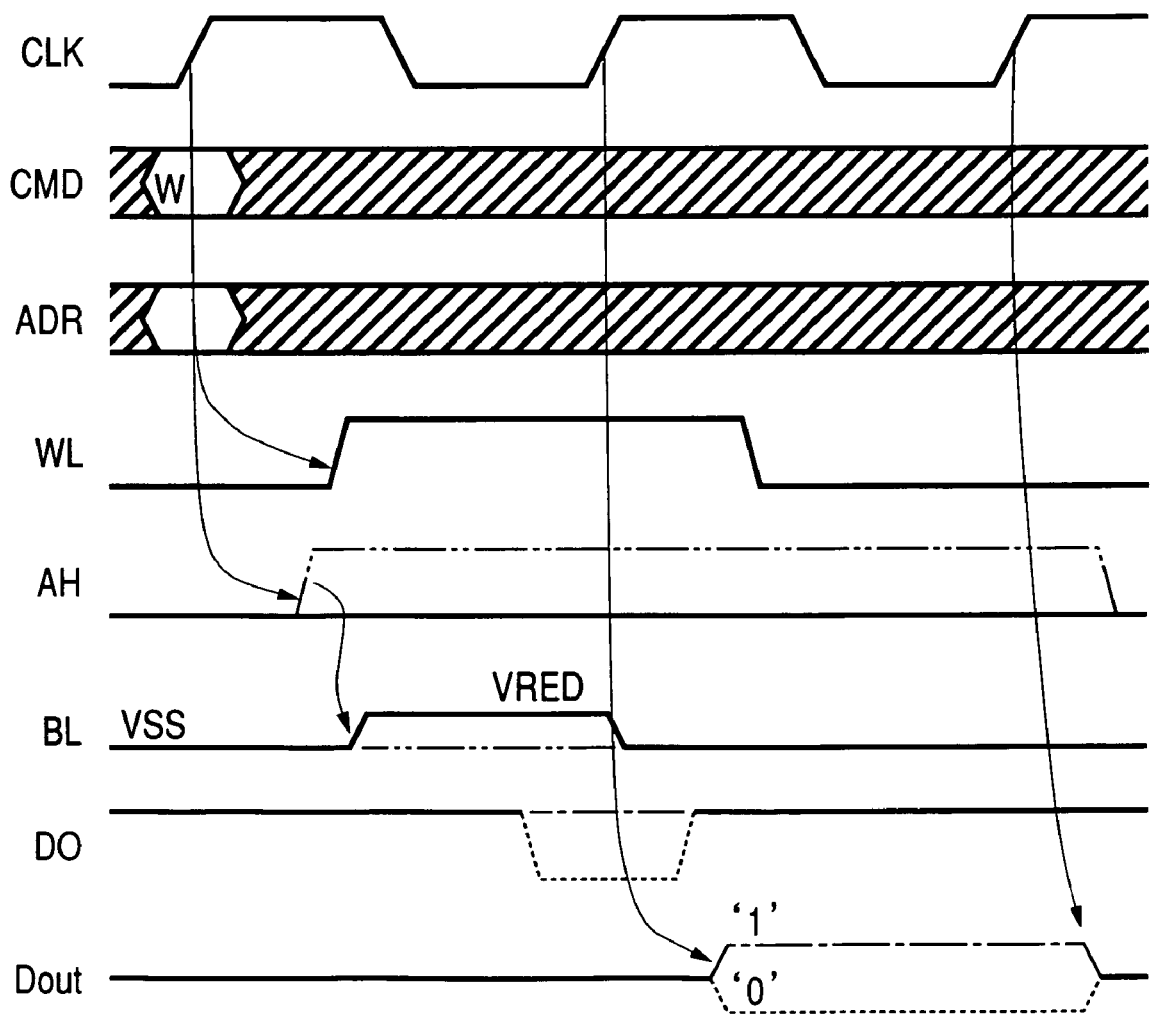
FIG. 11 shows an example of a read operation in the synchronous phase change memory.

FIG. 11 shows an example of the timing sequence for a read operation. In this example, the latency is 2. As with the write operation, if a read command R is given, an address ADR is taken into the address buffer AB to select a word line WL. In addition, the address comparator ACP compares the internal address AI with the retained write address AS and outputs the result on the address hit signal AH. As with the operation shown in FIG. 8, if the address hit signal AH is '0', a sense amplifier supplies a read voltage VRED to the selected bit line to recognize the data based on the magnitude of the flowing current. The read data DO is output by the data selector DOS as output data DS. If the address hit signal AH is '1', the sense amplifier remains in the standby state to keep the bit line BL to the ground voltage VSS. The data selector DOS outputs the retained write data DR as output data DS. In response to the next rising edge of the external clock CLK, the output buffer is activated to drive the input output data DQ to the output level Dout according to the output data DS. At the second next rising edge, the output buffer DOB is forced into the high impedance state.

Since the internal circuits are controlled according to the external clock CLK in timing as described above, timing control can be done easily for address comparison and so on.

In addition, since the memory is configured as a synchronous memory which performs command/address reception and data input/output in synchronization with the external clock CLK, it can operate at high frequency to realize high data rate. A variety of fast memory systems developed for SRAM and DRAM can be applied to this phase change memory of the present invention. For example, it can easily realize a burst operation which performs successive actions over plural cycles in response to one command.

Third Embodiment

Figure 12:
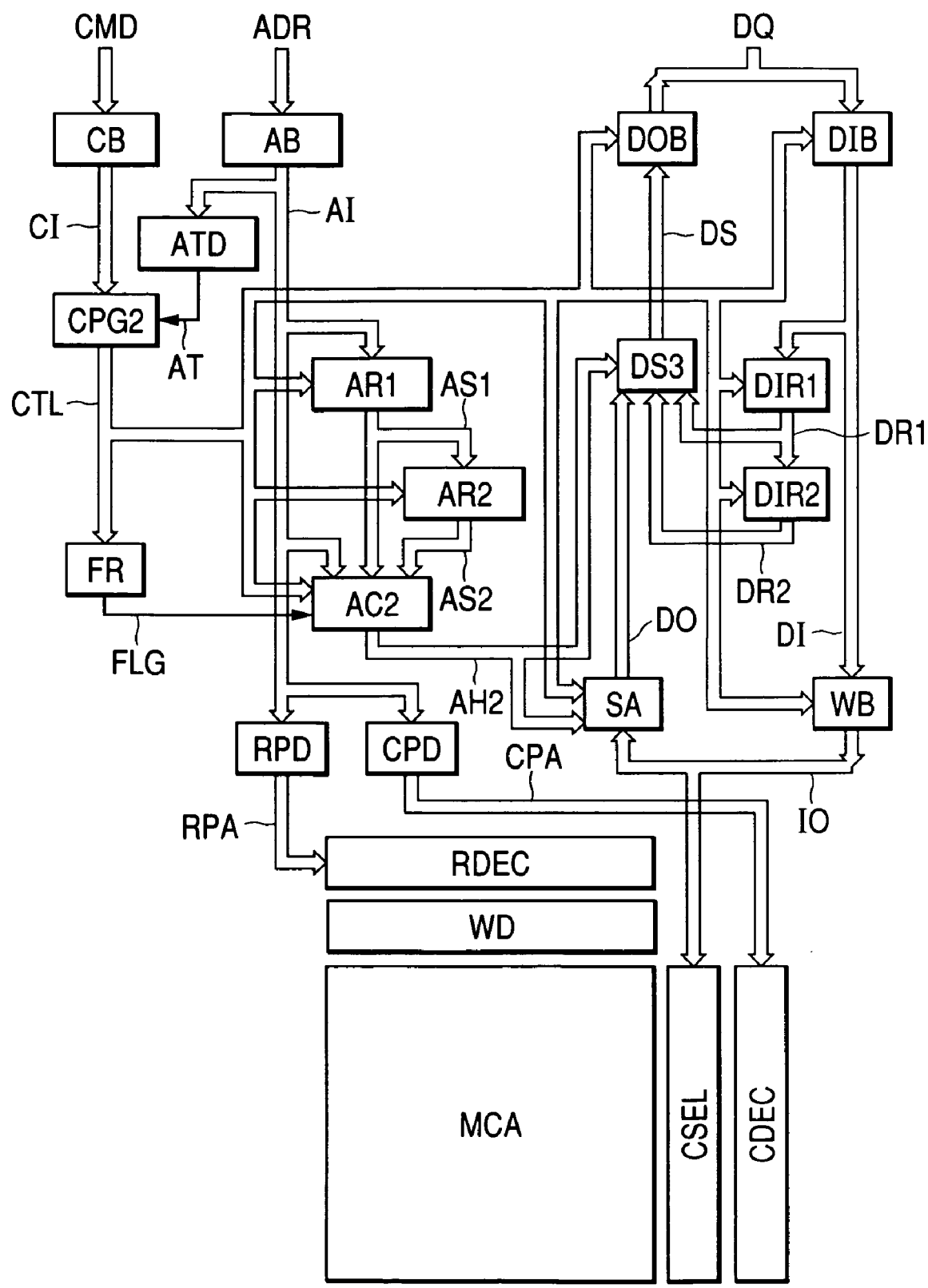
FIG. 12 is a block diagram showing an example of a configuration provided with two-stage registers.

FIG. 12 is a block diagram of another example of an asynchronous phase change memory configured in accordance with the present invention. It is characterized in that a first write data register DIR1 and second write data register DIR2 are provided to form a two-stage write data register and likewise a first write address register AR1 and second write address register AR2 form a two-stage write address register. An address comparator AC2 compares the internal address AI with the first retained write address AS1 and second retained write address AS2 and outputs an address hit signal AH2 indicating whether the internal address AI agrees with them. Controlled by the address hit signal AH2, an output data selector DS3 selects output data DS from the readout data DO, first retained write data DR1 and second retained write data DR2 and outputs the output data DS. If the internal address AI agrees with the first retained write address AS1, the first retained write data DR1 is selected. If the internal address AI agrees with not the first retained write address AS1 but the second retained write address AS2, the second retained write data DR2 is selected. If the internal address AI agrees with neither the first retained write address AS1 nor the second retained write address AS2, the readout data DO is selected. Note that if write operations are successively performed to the same address, the first retained write address AS1 becomes equal to the second retained write address AS2 and therefore the internal address AI agrees with both. In this case, the output data selector DS3 selects the first retained write data DR1 which was entered later.

As with the first embodiment shown in FIG. 1, the asynchronous phase change memory also includes a flag register FR, a command buffer CB, a control signal generator CPG2, an address buffer AB, an address transition detector ATD, a row predecoder RPD, a column predecoder CPD, an input buffer DIB, an output buffer DOB, a sense amplifier block SA and a write buffer block WB. Further, it has a memory cell array MCA provided with a row decoder RDEC, a word driver WD, a column decoder CDEC and a column selector CSEL. These circuits operate as described with FIG. 1. Also as with the first embodiment shown in FIG. 1, its write and read operations are performed respectively as shown in FIG. 7 and FIG. 8.

In this embodiment, write data is not only written to a memory cell but also stored in the write data register and retained therein until the second next write cycle. Read access to its address before the second next write cycle results in read out from a register without accessing to the memory array. Therefore, at least one write cycle is imposed during the period between a write operation to a memory cell and the subsequent read operation from the same memory cell. This makes the period longer and therefore allows more stable operation than in the embodiment shown in FIG. 1.

Although this embodiment is an asynchronous phase change memory, such a synchronous phase change memory as shown in FIG. 9 can also be configured to have a two-stage write data register and two-stage write address register. This configuration can also make longer the period between a write operation to a memory cell and the subsequent read operation from the same memory cell.

Fourth Embodiment

Figure 13:
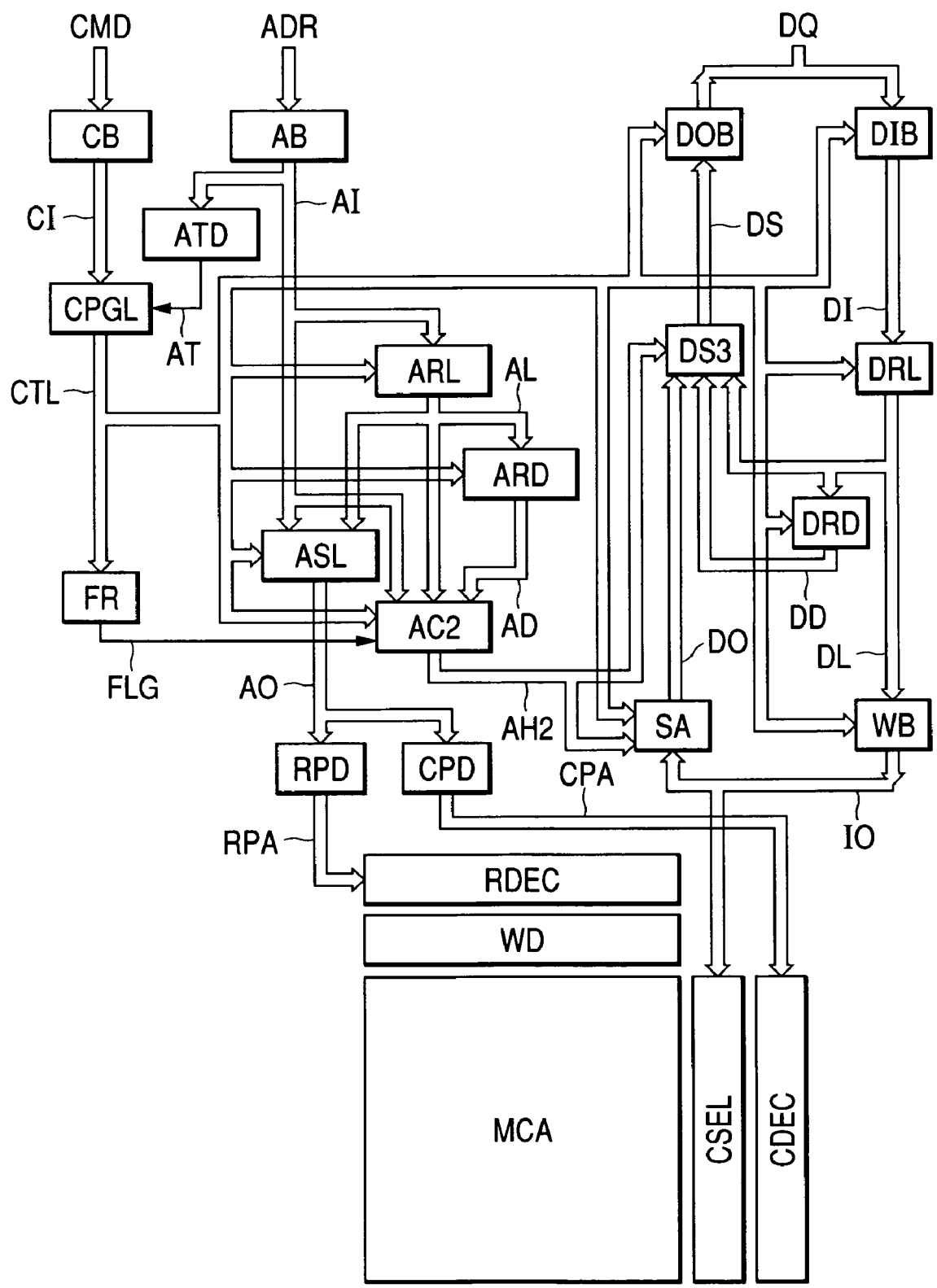
FIG. 13 is a block diagram showing an example of a configuration in which a late write operation is performed.

FIG. 13 is a block diagram of a key portion of another asynchronous phase change memory configured in accordance with the present invention. This embodiment is characterized by its write operation called a late write. Similar to the embodiment shown in FIG. 12, a first write data register DRL and second write data register DRD are provided to form a two-stage write data register and likewise a first write address register ARL and second write address register ARD form a two-stage write address register. Unlike the embodiment of FIG. 12, however, the first write data register DRL and first write address register ARL are provided for late write operation. An address selector ASL is provided to output the internal address AI or the first retained write address AL to a row predecoder RPD and column predecoder CPD as a selected address A0. The internal address AI is selected for read operation whereas the first retained write address AL is for write operation. The first retained write data DL is also sent to a write buffer block WB. As with the embodiment of FIG. 12, an address comparator AC2 compares the internal address AI with the first retained write address AL and the second retained write address AD and outputs an address hit signal AH2 indicating whether the internal address AI agrees with them. Controlled by the address hit signal AH2, an output data selector DS3 selects output data DS from the readout data DO, first retained write data DL and second retained write data DD and outputs the output data DS. This asynchronous phase change memory also includes a flag register FR, a command buffer CB, a control signal generator CPGL, an address buffer AB, an address transition detector ATD, a row predecoder RPD, a column predecoder CPD, an input buffer DIB, an output buffer DOB, a sense amplifier block SA and a write buffer block WB. Further, it has a memory cell array MCA provided with a row decoder RDEC, a word driver WD, a column decoder CDEC and a column selector CSEL. They operate as described with FIG. 1.

Figure 14:
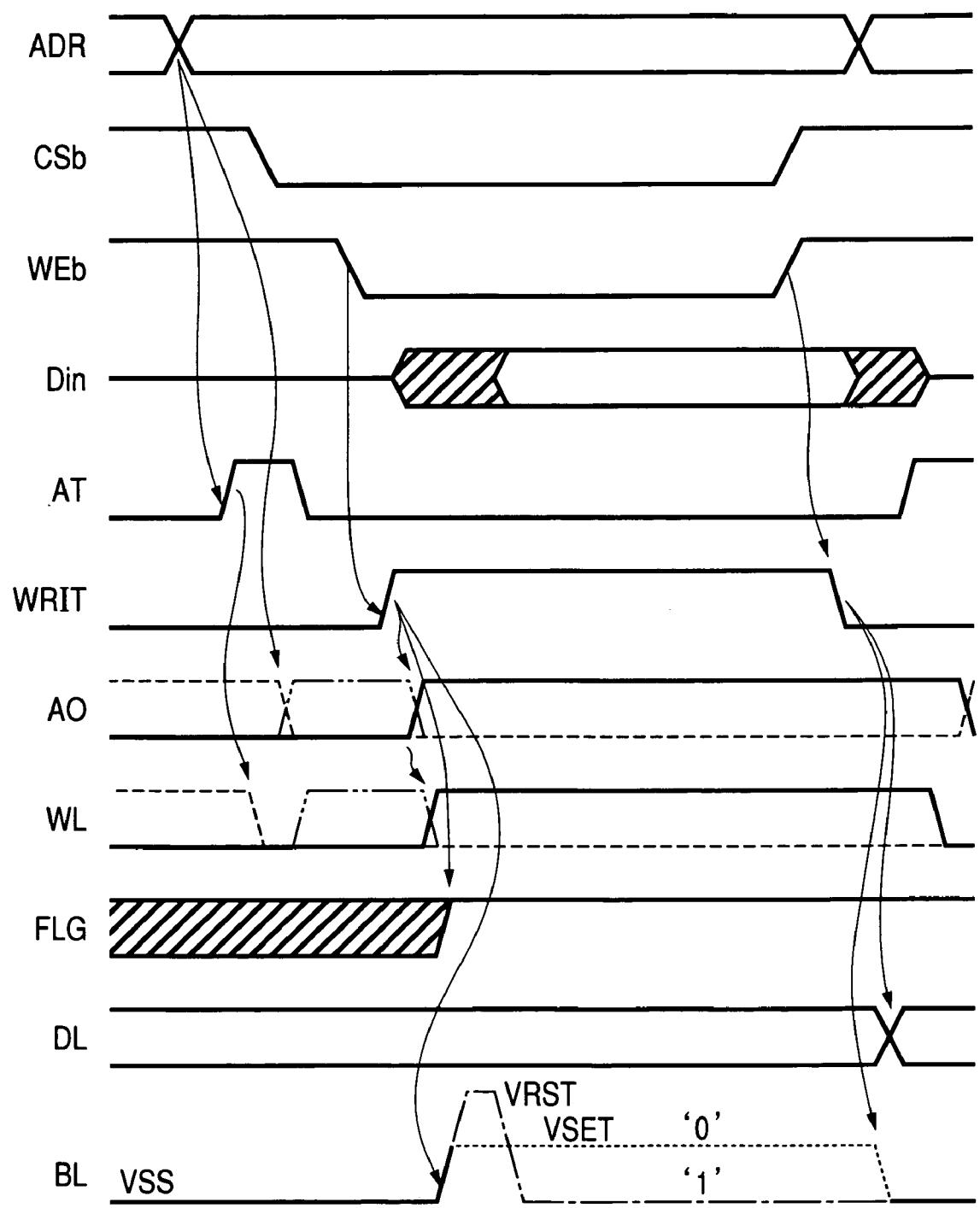
FIG. 14 shows an example of a late write operation.

FIG. 14 shows an example of the timing sequence for a write operation. In response to a transition of the external address ADR, a pulse is generated on the address transition signal AT, which changes the internal address AI and selected address A0 to switch the selected word line WL. Thereafter, a chip select bar signal CSb and write enable bar signal WEb, parts of the command signal CMD, fall to the low level, which sets the write instruction signal WRIT to '1' to initiate a write operation. Thus, an address selector ASL outputs the first retained write address as the selected address A0 to re-switch the selected word line WL. The flag FLG is set to '1'. The write buffer block WB drives the selected bit line BL according to the first retained write data DL. Here, if the retained write data is '0', the bit line BL is driven to a set voltage VSET, whereas if '1', the bit line BL is driven to a reset voltage VRST for a desirable time. When either the chip select bar signal CSb or the write enable bar signal WEb rises to the high level to terminate the write operation period, the first write address register ARL and first write data register DRL respectively take in the internal address AI and input data DI whereas the second write address register ARD and second write data register DRD respectively take in the first retained write address AL and first retained write data DL. The write operation is terminated with the bit line BL returned to the ground voltage VSS.

Even in a system where the input Din is validated when a write operation period is terminated, data can be written by such a late write operation after validated. This allows longer time for a write operation to a memory cell, making the resistivity-lowering period longer. In addition, since the resistivity of the phase change resistor can be raised earlier, it is possible to impose longer time between the time when the resistivity of a cell is raised and the time when the subsequent read operation is made from the cell. Thus, stable write operation can be realized both for '0' and '1'.

Its timing sequence for a read operation is similar to that shown in FIG. 8 for the embodiment of FIG. 1. Introducing the late write operation does not impose large speed penalty on the read operation.

Since in this embodiment configured so as to perform late write operations, information in the registers is lost if the power supply is turned off, write data in the last write cycle is not retained after the power supply is turned off. Therefore it is preferable to prescribe as a specification that a dummy write cycle should be imposed before the power supply is turned off.

The reset-to-read interval, if must not be so long, may be secured only by performing a late write operation without retaining the data written into a memory cell. In this case, the second write data register DRD and second write address register ARD are removed. In addition, the embodiment is modified in such a manner that the address comparator AC2 compares the internal address AI with the first retained write address AL and the output data selector DS3 selects output data from the readout data D0 and first retained write data DL and outputs it as the output data DS. As compared with that shown in FIG. 13, this configuration not only simplifies the control but also saves power since the current consumed by the registers, etc. can be reduced.

Fifth Embodiment

Figure 15:
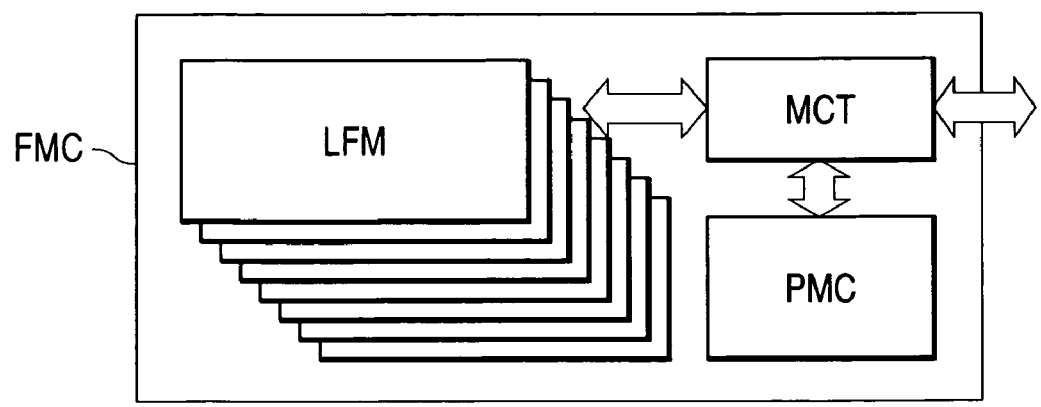
FIG. 15 is a block diagram of a system LSI where a phase change memory is used.

The following describes an example of an application of a phase change memory in accordance with the present invention. FIG. 15 is an example of a configuration of a flash memory card. A flash memory card FMC has a plurality of large capacity flash memories LFMS, a memory controller MCT and a phase change memory PMC. By using the phase change memory PMC as a buffer, the memory controller MCT exchanges signals with the external and controls the large capacity flash memories LFMs.

Using a phase change memory, a high speed non-volatile memory, as a buffer makes it possible to retain the data which is yet to be written into a large capacity flash memory even after the power supply is turned off. As a result, the flash memory card FMC can be removed from the equipment immediately after write data is all transferred, improving the usability.

Besides this example, phase change memories by the present invention may be used in a variety of applications. For example, in the field of mobile phones, a NOR flash memory combined with a low power SRAM may be replaced by one chip. This not only saves the cost but also reduces the pyhsical volume.

Sixth Embodiment

Figure 16:
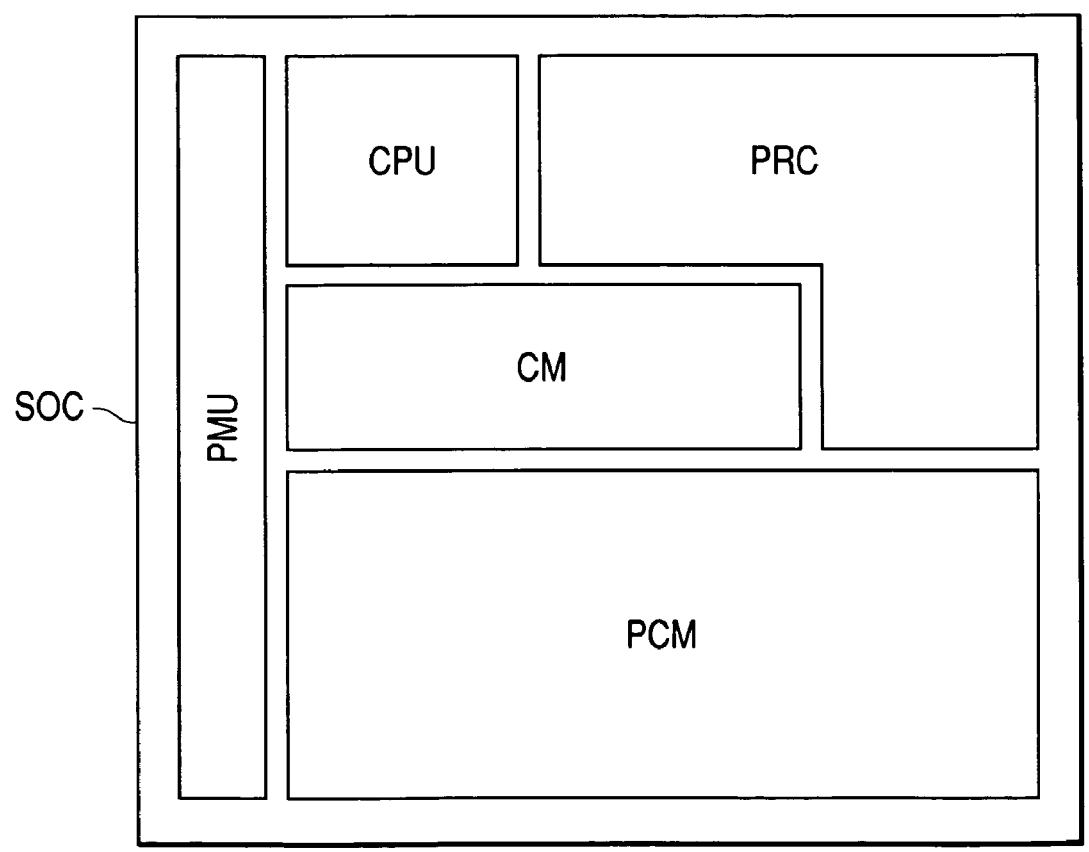
FIG. 16 is a block diagram of a memory card where a phase change memory is used.

Phase change memories by the present invention can also be applied as on-chip memories. FIG. 16 shows an example of a configuration of a system LSI. A system LSI chip SOC has a processor module CPU, a cache memory module CM, a peripheral module PRC and a power management module PMU.

The phase change memory PCM can be implemented as a large capacity on-chip memory since a small memory cell can be constituted with one phase change resistor and one transistor as shown in FIG. 2. In addition, thanks to the non-volatility, it is possible to turn off the power supply by the power management module PMU when the system LSI chip SOC is in the standby state without losing the data. Since it is not necessary to save data to the external, the system LSI chip SOC is free from power overhead for data transfer and therefore allows frequent power off by fine power management. This low power system LSI is suitable for mobile devices such as mobile phones.

A representative effect of the present invention is to provide a phase change memory which writes data to a memory cell by applying current to the phase change memory, characterized in that without elongating the cycle time, it is possible not only to use long time to write data into a memory cell or lower the resistivity of the phase change resistor therein but also to make longer the interval between the time a write operation is done to raise the resistivity of the phase change resistor and the time when the subsequent read operation is made from that memory cell. As a result, data can be written reliably. In other words, the cycle time required to realize reliable write operations can be shortened. Accordingly, it is possible to implement a semiconductor device where a high-speed non-volatile memory is integrated.

What is claimed is:

1. A semiconductor device comprising:
    a non-volatile memory cell array including a plurality of word lines, a plurality of bit lines intersected with the plurality of word lines, and a plurality of non-volatile memory cells arranged at respective positions where the plurality of word lines are intersected with the plurality of bit lines;
    a write data register holding a write data; and
    a write buffer connected to the non-volatile memory cell array and supplying a write signal corresponding to the write data to the non-volatile memory cell,
    wherein in a first write cycle, the write data register fetches the write data from outside of the semiconductor device,
    wherein in a second write cycle after the first write cycle, the write data register outputs the write data to the write buffer and the write buffer supplies the write signal to the non-volatile memory array, and
    wherein the semiconductor device performs a dummy write cycle to write the write data held in the write data register to the non-volatile memory array before the power supply to the non-volatile memory array, the write data register, and the write buffer is turned off.

2. A semiconductor device according to claim 1, further comprising:
    an address register holding an access address corresponding to the write data held in the write data register; and
    a comparator comparing an access address from the outside of the semiconductor device and the access address held in the address register,
    wherein when the access address from the outside of the semiconductor device agrees with the access address held in the write data register in a read cycle, the semiconductor device outputs a read data from the write data register.

3. A semiconductor device according to claim 1, further comprising:
    a flag register indicating whether the write data held in the write data register is valid or not.

4. A semiconductor device according to claim 1, further comprising:
    a processor module;
    a power management module controlling the power supply to the non-volatile memory array, the write data register, the write buffer, and the processor module.
    wherein the non-volatile memory array, the write data register, the write buffer, the processor module, and the power management module are formed on a semiconductor chip.

5. A semiconductor device according to claim 1, wherein each of the plurality of memory cells includes a phase change resistor.

* * * * *